United States Patent
Stendel et al.

(10) Patent No.: US 12,033,774 B2
(45) Date of Patent: Jul. 9, 2024

(54) NTC THIN FILM THERMISTOR AND METHOD FOR PRODUCING AN NTC THIN FILM THERMISTOR

(71) Applicant: TDK Electronics AG, Munich (DE)

(72) Inventors: Thomas Stendel, Berlin (DE); Jan Ihle, Raaba-Grambach (AT); Christl Lisa Mead, St. Martin i. S. (AT); Thomas Bernert, Deutschlandsberg (AT); Sebastian Redolfi, Graz (AT); Marko Vrabelj, Apace (SI)

(73) Assignee: TDK Electronics AG, Munich (DE)

( * ) Notice: Subject to any disclaimer, the term of this patent is extended or adjusted under 35 U.S.C. 154(b) by 301 days.

(21) Appl. No.: 17/617,760

(22) PCT Filed: Jul. 3, 2020

(86) PCT No.: PCT/EP2020/068864
§ 371 (c)(1),
(2) Date: Dec. 9, 2021

(87) PCT Pub. No.: WO2021/004957
PCT Pub. Date: Jan. 14, 2021

(65) Prior Publication Data
US 2022/0238260 A1 Jul. 28, 2022

(30) Foreign Application Priority Data
Jul. 5, 2019 (DE) ............ 10 2019 118 299.9

(51) Int. Cl.
*H01C 7/04* (2006.01)
*H01C 1/14* (2006.01)
(Continued)

(52) U.S. Cl.
CPC ............... *H01C 7/042* (2013.01); *H01C 1/14* (2013.01); *H01C 7/006* (2013.01); *H01C 17/075* (2013.01);
(Continued)

(58) Field of Classification Search
CPC .......... H01C 7/042; H01C 7/006; H01C 1/14; H01C 17/075; H05K 1/182; H05K 2201/10196
See application file for complete search history.

(56) References Cited

U.S. PATENT DOCUMENTS

| 4,743,881 A | 5/1988 | Howng |
| 5,218,335 A | 6/1993 | Nakano |

(Continued)

FOREIGN PATENT DOCUMENTS

| CN | 1367497 A | 9/2002 |
| CN | 1444240 A | 9/2003 |

(Continued)

OTHER PUBLICATIONS

JP 2000348911, machine translation. (Year: 2000).*

(Continued)

*Primary Examiner* — Kyung S Lee
(74) *Attorney, Agent, or Firm* — Nixon Peabody LLP

(57) ABSTRACT

An NTC thin film thermistor that includes at least a first thin film electrode, at least an NTC thin film, and at least a second thin film electrode. A further aspect relates to a method for producing an NTC thin film thermistor.

27 Claims, 5 Drawing Sheets

(51) Int. Cl.
*H01C 7/00* (2006.01)
*H01C 17/075* (2006.01)
*H05K 1/18* (2006.01)

(52) U.S. Cl.
CPC ... *H05K 1/182* (2013.01); *H05K 2201/10196* (2013.01)

(56) References Cited

U.S. PATENT DOCUMENTS

| | | | |
|---|---|---|---|
| 6,377,467 | B1 | 4/2002 | Chu |
| 6,475,604 | B1 * | 11/2002 | Fujii ................ H01C 17/12 428/209 |
| 9,697,934 | B2 | 7/2017 | Bourns |
| 2002/0101326 | A1 | 8/2002 | Lavenuta |
| 2003/0062984 | A1 | 4/2003 | Ito |
| 2003/0099077 | A1 | 5/2003 | Chu |
| 2003/0170432 | A1 | 9/2003 | Kobayashi |
| 2004/0216305 | A1 | 11/2004 | Kobayashi |
| 2008/0079118 | A1 | 4/2008 | Bang |
| 2012/0188051 | A1 | 7/2012 | Miura |
| 2013/0258544 | A1 | 10/2013 | Namikawa |
| 2013/0328154 | A1 | 12/2013 | Miura |
| 2014/0232514 | A1 | 8/2014 | Miura |
| 2015/0170805 | A1 | 6/2015 | Ito |
| 2016/0299011 | A1 | 10/2016 | Ihle |
| 2017/0194419 | A1 | 7/2017 | Joon |
| 2018/0130577 | A1 | 5/2018 | Toda |
| 2018/0371656 | A1 | 12/2018 | Yung |
| 2019/0098761 | A1 | 3/2019 | Yoshida |
| 2020/0166415 | A1 | 5/2020 | Yagyu |
| 2022/0238260 | A1 | 7/2022 | Stendel |
| 2022/0357214 | A1 | 11/2022 | Weinenfelder |

FOREIGN PATENT DOCUMENTS

| | | |
|---|---|---|
| CN | 101241786 A | 8/2008 |
| CN | 102483978 A | 5/2012 |
| CN | 102800449 A | 11/2012 |
| CN | 107251168 A | 10/2017 |
| DE | 4113372 C2 | 7/2000 |
| DE | 10245313 A1 | 5/2003 |
| DE | 102012110849 A1 | 5/2014 |
| DE | 112013003510 T5 | 4/2015 |
| DE | 102020122923 A1 | 3/2022 |
| EP | 2902761 B1 | 11/2016 |
| JP | S61-245502 A | 10/1986 |
| JP | H04-150001 A | 5/1992 |
| JP | H11-345705 A | 12/1999 |
| JP | 2000348911 A | 12/2000 |
| JP | 2004-335731 A | 11/2004 |
| JP | 2008244344 A | 10/2008 |
| JP | 2013-197367 A | 9/2013 |
| JP | 2021-155906 A | 10/2021 |
| KR | 20050029884 A | 3/2005 |
| WO | 2018164570 A1 | 9/2018 |
| WO | WO 2018/207676 A1 | 11/2018 |
| WO | WO 2021/004957 A1 | 1/2021 |

OTHER PUBLICATIONS

Notice of Grant in related Japanese Patent Application No. 2021-576754, dated Jun. 27, 2023, in Japanese (3 pages).
Examination Report in related European Patent Application No. 20739589.8, dated Jun. 21, 2023, in German (7 pages).
Examination Report in related German Patent Application No. 10 2022 126 526.9, dated Oct. 10, 2023, in German (9 pages).
International Search Report, English translation of International Search Report, and Written Opinion of International Searching Authority corresponding to International Patent Application No. PCT/EP2020/068864, mailed Oct. 14, 2020 (13 pages).
Examination Report in related Chinese Patent Application No. 202080049138.4, dated Feb. 15, 2023 (6 pages).
International Search Report in related International Patent Application No. PCT/EP2023/077998, mailed Jan. 19, 2024, in German (17 pages).

* cited by examiner

NTC THIN FILM THERMISTOR AND METHOD FOR PRODUCING AN NTC THIN FILM THERMISTOR

CROSS-REFERENCE TO RELATED APPLICATIONS

This application is a U.S. National Stage of International Application No. PCT/EP2020/068864, filed Jul. 3, 2020, which claims the benefit of Germany Patent Application No. 102019118299.9, filed Jul. 5, 2019, both of which are incorporated herein by reference in their entireties.

The invention relates to an NTC thin film thermistor and a method of manufacturing an NTC thin film thermistor.

Due to miniaturization, it is of great interest to reduce the size of electronic parts, components and sensors in order to accommodate the largest possible number of electronic components in the end devices and to make them more powerful. In particular, an ever-increasing number of sensors are being incorporated into end devices with the aim of making them more intelligent and safer.

NTC thermistors are resistors with negative temperature coefficients that are commonly used as sensors to measure temperature in electronic devices. In patent document US 20090179732 A1, advantageous ceramics for an NTC thermistor are presented. In the examples, typical NTC thermistors are shown in a multilayer assembly, in which the ceramics are processed into films that have a thickness of 20 to 50 µm, and the finished multilayer NTC thermistor has an extension of several millimeters in all three spatial directions. Such a size is not suitable for many applications. By significantly reducing their dimensions, it is possible not only to make room for other components in the applications, but also to open up completely new applications and fields.

For example, by making NTC thermistors extremely thin, they can be flexible and therefore mechanically bendable without being destroyed. Furthermore, if an NTC thermistor is realized with low expansion, this possibly lowers its thermal mass and thus improves the response time and sensitivity of the NTC thermistor.

Therefore, it is desirable to make an NTC thermistor with a small dimension in all spatial directions and a particularly flat NTC thermistor.

It is an object of the present invention to provide an advantageous NTC thin film thermistor and a method of manufacturing an NTC thin film thermistor.

The present task is solved by the NTC thin film thermistor according to claim 1 as well as by a method for manufacturing an NTC thin film thermistor according to the further independent claim. Further advantageous embodiments, potential arrangements and possible process steps can be found in the further claims.

An NTC thin film thermistor is described, which comprises at least one first thin film electrode, at least one NTC thin film and at least one second thin film electrode. The design of the electrodes as well as the functional NTC layer as a thin film makes it possible to realize an NTC thermistor with an extremely small expansion, especially with regard to the thickness. In this context, a thin film can be understood to mean, in particular, layers consisting of solid substances in the micrometer range. Alternatively or supplementarily, a thin film can be understood to mean a layer with a thickness of less than 10 µm. An NTC thin film thermistor according to the present invention has preferably only thin film electrodes and thin films and no other types of layers.

By significantly reducing dimensions of an NTC thermistor, not only space can be made available for other components in the applications, but in addition, completely new applications and fields can be opened up. By making NTC thermistors extremely thin, for example, they can be flexible and therefore mechanically bendable without being destroyed. Furthermore, if an NTC thermistor is realized with low expansion, this lowers its thermal mass and can thus improve the response time and sensitivity of a sensor that has the NTC thermistor.

The NTC thin film may comprise a single crystalline or polycrystalline functional ceramic, which may have a spinel structure or a perovskite structure. Such materials have a characteristic nonlinear temperature coefficient that can be used to provide accurate temperature measurement. In addition, functional ceramics with a perovskite structure are particularly suitable for use at high temperatures because the electrical properties of perovskite structures are less affected than spinel structures at high temperatures.

The NTC thin films can have at least the elements Mn and Ni and at least one of the elements Zn, Fe, Co, Cu, Zr, Y, Cr, Ca, Al. These elements are suitable to form a functional ceramic with a spinel, or perovskite structure. By changing the proportions of the different elements in the functional ceramic, the B value of the NTC thin film can be adjusted so that the slope of the temperature coefficient is particularly steep in the temperature range of interest for an application, thus enabling precise temperature measurement.

Furthermore, the thin film electrodes can be made of a conductive ceramic. A conductive ceramic adheres more strongly to a functional ceramic than alternative materials, such as a metal. Furthermore, a thin film electrode made of a conductive ceramic has a similar coefficient of thermal expansion as a functional ceramic, which can prevent mechanical distortions in the NTC thin film thermistor as the temperature changes.

Alternatively, the thin film electrodes may consist of one or more layers of metals such as Cu, Pt, Cr, Ni, Ag, Pd, Au, Ti or a mixture, an intermetallic compound, and an alloy of these elements. Thin film metal electrodes exhibit high electrical conductivity, which allows the NTC thin film thermistor to have lower electrical connection resistance.

In one embodiment, the first and second thin film electrodes are disposed on a surface of the NTC thin film. Thus, the NTC thin film thermistor can be formed thinner than in an embodiment in which the NTC thin film is disposed between the first and second electrodes. Furthermore, in an embodiment in which the electrodes are arranged on a surface, a measurement current runs along the NTC thin film rather than perpendicular to the film. Since the extensions of the surface of the functional NTC thin film may be many times the thickness of the NTC thin film, such an embodiment of an NTC thin film thermistor can demonstrate more precise measurement accuracy.

Further, the first and second thin film electrodes may be arranged in an interdigitated comb structure on one surface. Since the electrodes in a common comb structure are equidistant from each other, the same electric field acts between the electrodes for a given measurement voltage. Therefore, the measurement current of an NTC thin film thermistor provided with electrodes having an interdigitated comb structure exhibits advantageous linearity with respect to an applied measurement voltage.

In a further embodiment, the NTC thin film thermistor may have a plurality of first and second thin film electrodes, with one NTC thin film disposed between each of the first thin film electrodes and the second thin film electrodes. In such an embodiment, the measurement current is perpendicular to the surface of the NTC thin films. Therefore, the lateral extent of the entire NTC thin film thermistor can be much smaller in contrast to an NTC thin film thermistor having first and second electrodes on one surface of the NTC thin film. By stacking multiple NTC thin films on top of each other, the measurement accuracy of the NTC thin film thermistor can additionally be increased.

Furthermore, in a region in which they overhang with respect to the NTC thin film, the first and second thin film electrodes can rest on a respective underlying first or second thin film electrode, which also overhangs with respect to the NTC thin film. The overlying thin film electrode can be form-fitted to the underlying thin film electrode. By having thin film electrodes already applied, the surface finish or topography may have unevenness or slopes in the areas that overhang relative to the NTC thin film electrode. By form-fitting the thin film electrodes to the underlying thin film electrodes, these unevenness or slopes are traced and the electrical contact area and adhesion between adjacent thin film electrodes are increased. This ensures that each of the thin film electrodes is electrically contacted. In multilayer components, there can easily be difficulties with the electrical contacting of inner electrode layers, especially if the electrode layers are flush with the component at the edge of the multilayer component. In such multilayer components, only the cross-sectional areas of the electrode layers that are exposed at the edge of the multilayer component can be used as contact areas for further electrical contacting. Since the cross-section of the electrode layers can be very small, especially in the case of thin film electrodes, the electrical resistance of the component can become unintentionally high, or even individual electrode layers can remain completely electrically isolated. By allowing the thin film electrodes to protrude with respect to the NTC thin films and to rest on each other in a form-fitting manner, electrical contacting of each thin film electrode is favored.

Furthermore, the first and second thin film electrodes may be shorter in a region where they overhang relative to the NTC thin film than underlying first or second thin film electrodes that overhang relative to the NTC thin film. As a result of such an embodiment, a staircase shape is formed by the thin film electrodes, which tapers the component in the thickness direction. Each thin film electrode forms a stair step in this case. Since each thin film electrode forms a contact surface, analogous to the stair step, each individual thin film electrode can be directly electrically contacted. This reduces the risk of an internal electrode located inside the NTC sensor remaining electrically isolated and non-functional. The contact surface of the individual thin film electrodes and also of the entire NTC sensor can be increased by shortening each thin film electrode even further relative to an underlying thin film electrode. This leaves a larger surface area of the underlying thin film electrode that can be used as a contact surface for electrical contacting. By increasing the contact surface of the NTC thin film sensor, the contact resistance of the component is lowered. Due to the characteristic of an NTC resistor, according to which the resistance decreases with increasing temperature, a low contact resistance is particularly advantageous for accurate measurements in high temperature ranges.

Further, the first thin film electrodes on a first side of the NTC thin film thermistor may be overhanging with respect to the NTC thin film, and the second NTC thin film electrodes on the first side may be shortened with respect to the NTC thin film, and the second thin film electrodes may overhang on a second side of the NTC thin film thermistor opposite to the first side with respect to the NTC thin film and the first thin film electrodes may be shortened on the second side with respect to the NTC thin film. As a result of such an embodiment, a staircase shape is formed on a first and second side of the NTC thin film thermistor, which tapers the component in the thickness direction. By elongating one electrode on one of the two sides relative to the NTC thin film, the individual thin film electrodes overlap on that side and can thus be contacted together. Since the other electrode on this side is shortened relative to the NTC thin film, there is always an NTC thin film between the electrodes, thus preventing a short circuit between the first and second electrodes.

The portions of the first and second thin film electrodes protruding at the first and second sides may be reinforced with a metallized paste or other conductive medium. Even though a plurality of layers of the thin film electrodes overlap at the overlapping portion of the thin film electrodes, the electrodes are still formed to be extremely thin and fragile at these portions. For example, a metallized paste can be applied to the overlapping partial area to strengthen the electrodes and facilitate contacting of the electrodes.

Further, the NTC thin films may be overhanging with respect to the thin film electrodes on a third and fourth side, which are perpendicular to the first and second sides and are opposite to each other. An overhang of the non-conductive NTC thin film ensures that the first and second thin film electrodes are also encapsulated from each other in the edge regions. In this way, it can be ensured that first and second electrodes do not short-circuit despite the small distance between them.

The NTC thin films can be shorter in an area where they overhang relative to the thin film electrodes than the NTC thin film underneath. This forms a diagonal edge of the NTC thin film thermistor on the sides where the NTC thin film overhangs. A truncated pyramid-shaped design of the NTC thin film thermistor provides a low center of gravity, making the component more stable.

The NTC thin film thermistor can additionally be arranged on a carrier material. The carrier material can increase the mechanical stability of the NTC thin film thermistor. A high level of mechanical stability is particularly important for transport and installation of the component in order to avoid damage. Therefore, the component can be arranged on a carrier material.

The carrier material can already be formed as a first electrode. A thicker conductive ceramic layer or a stable metal layer can serve as a carrier material for this purpose. Thus, the provision of an additional carrier material can be avoided.

A circuit or microelectronic mechanical system can be integrated into the carrier material, or the carrier material can be a part of an electronic component. In this way, the NTC thin film thermistor can be integrally connected and contacted to an electrical component. In addition to electrical components made of semiconductors such as silicon, electrical components made of ceramics are exceptionally suitable for integration of an NTC thin film thermistor, since they have a similar coefficient of thermal expansion to the NTC thin film thermistor.

Furthermore, a protective layer can be applied to the NTC thin film thermistor or the entire component can be embedded in a protective layer to protect the component from mechanical, chemical and other environmental influences. Suitable materials for the protective layer can be glass, silicone or other polymers.

In an advantageous embodiment, the NTC thin film can be thinner than 3 µm. Thus, a thin design of the NTC thin film thermistor, even with multiple NTC thin films, is possible. It should also be noted that the NTC thin film must be thick enough to avoid a short circuit between electrodes. A thickness greater than 0.01 μm is therefore advisable for typical voltage ranges and materials.

In another embodiment, the thin film electrodes may be thinner than 10 μm. If the thin film electrodes were formed much thicker, a thin design of the NTC thin film thermistor could be prevented.

The entire NTC thin film thermistor can be thinner than 100 μm. Thus, it is ensured that the advantage of the individual very thin thin films is transferred to the entire component, and the entire NTC thin film thermistor remains very thin.

The NTC thin film thermistor may be suitable for being integrated into a substrate or printed circuit board. Substrates and also printed circuit boards can often have a thickness of only a few 100 μm. Since an NTC thin film thermistor according to the present invention can be thinner, it can not only be mounted as an SMD component on a substrate or a printed circuit board, but can also be integrated therein.

An advantageous arrangement may include a printed circuit board and an NTC thin film thermistor, wherein the NTC thin film thermistor is integrated into the printed circuit board. Consequently, not only can space be saved on the circuit board that can be used for other components, but the integration of the NTC thin film thermistor into the circuit board simultaneously extends its functionality.

In another advantageous arrangement, several NTC thin film thermistors can be arranged in a matrix. Due to the small size of the NTC thin film thermistors, especially with regard to their required surface area, the NTC thin film thermistors are excellently suited for sensor applications in which spatially resolved temperature measurement is to be performed. For this purpose, a plurality of NTC thin film thermistors are arranged side by side on a matrix.

Another aspect of the present application relates to a method of manufacturing an NTC thin film thermistor. The NTC thin film thermistor may be, in particular, the previously described NTC thin film thermistor.

The method comprises the steps of:
a) providing a non-conductive carrier material;
b) Applying at least a first thin film electrode;
c) depositing at least one NTC thin film electrode
d) applying at least one second thin film electrode.

A non-conductive carrier material may be required as a flat base surface to form the further layers thereon. Only after at least one NTC thin film layer and at least one first and second thin film electrodes are completed, the NTC thin film thermistor is functional.

A circuit or microelectronic mechanical system may be integrated into the carrier material, or the carrier material may be a component of an electronic component. Thus, an electrical component can be upgraded with an NTC thin film thermistor. The integrative design allows the electrical component to be directly connected and electrically contacted to the NTC thin film thermistor. In particular, electrical components made of ceramics are suitable as a carrier material because they have a similar coefficient of thermal expansion to the NTC thin film thermistor and the NTC thin film thermistor adheres well to them. Electrical components, circuits, and microelectronic mechanical systems made of semiconductors, such as silicon, can also be used as carrier materials.

In the method, the first and second thin film electrodes may be disposed on one surface of the NTC thin film. An NTC thin film thermistor according to such a method can be made thinner than in an assembly in which the NTC thin film is arranged between the first and second electrodes. In an arrangement in which both thin film electrodes are on one surface, the measurement current runs along the NTC thin film and not perpendicularly through the film. Due to the lateral expansions of the NTC thin film thermistor, which may be a multiple of the thickness of the NTC thin film, such an NTC thin film thermistor may exhibit more precise measurement accuracy.

In another embodiment of the method, an NTC thin film may be disposed between each of the first thin film electrodes and the second thin film electrodes. In an NTC thin film thermistor formed according to a method of this embodiment, the measurement current runs perpendicular to the surface through the NTC thin films. The lateral extent of such an NTC thin film thermistor does not affect the measurement accuracy to a very high degree, in contrast to an NTC thin film thermistor having first and second electrodes on one surface of the NTC thin film. Therefore, an NTC thin film thermistor can have a much smaller expansion according to these methods. Furthermore, the NTC thin films can be stacked on top of each other to improve the measurement accuracy of the NTC thin film thermistor.

The method can also be carried out such that in step b), the first thin film electrodes are also deposited in a first region where no NTC thin film is underlying, and that in step d), the second thin film electrodes are also deposited in a second region where no NTC thin film is underlying, wherein the first and second regions do not overlap and the method includes a sequence of steps in which first a first thin film electrode layer is applied, then an NTC thin film layer is applied, then a second thin film electrode is applied, whereupon an NTC thin film layer is applied again, and subsequently a first thin film electrode is applied again.

Thus, in the two areas where the thin film electrodes overhang the NTC thin film, the thin film electrodes lie in a form-fitting manner on a respective underlying first or second thin film electrode. An NTC thin film thermistor fabricated based on this method has the advantage that the thin film electrodes arranged inside the NTC thin film thermistor are electrically contacted more reliably, making the entire component more robust.

In addition, in step b) and d), the thin film electrodes in the two regions can also each be applied shorter than the underlying first or second thin film electrodes. In this way, a staircase shape is formed in each of the first and second regions, with the individual staircase steps being formed from the thin film electrodes. Depending on how much the thin film electrode has been shortened compared to the thin film electrode below, the contact area of the thin film electrodes can be increased and thus the contact resistance reduced. Such an NTC thin film thermistor is particularly suitable for precise temperature measurements at high temperatures, since an NTC resistance decreases with increasing temperature.

The NTC thin films can be deposited using a chemical solution deposition (CSD) process in any of the listed methods. Depending on the geometry and materials used, spin coating, dip coating or ink jet printing, each of which is a CSD process, can be used for this purpose. Ink jet printing has the advantage that the NTC thin films can be adapted in a modular fashion and the process is more variable.

Alternatively, both the first and second thin film electrodes and the NTC thin films can be deposited using a PVD, or CVD process in the aforementioned processes. Thus, it can be ensured that all layers can be formed as thin films.

Continuing the process steps mentioned, the NTC thin film thermistor can, in a further process step, be subjected to a sintering process. The sintering process makes the NTC thin film, which is usually in the form of a functional ceramic, more mechanically resilient and resistant to deformation. In addition, depending on the deposition process, a perovskite, or spinel structure can often be formed only during a cooling process.

Following the processes, the NTC thin film thermistor can be released from the carrier material, or the carrier material can be thinned or completely removed using a grinding process or etching process. Consequently, for each NTC thin film thermistor, it can be weighed whether a small thickness or some mechanical stability of the NTC thin film thermistor is a priority. Depending on preference, the thickness of the carrier material may be reduced to a desired level, or the NTC thin film thermistor may be directly released from the carrier material.

The invention is described in more detail below with reference to schematic diagrams.

Figure 1:
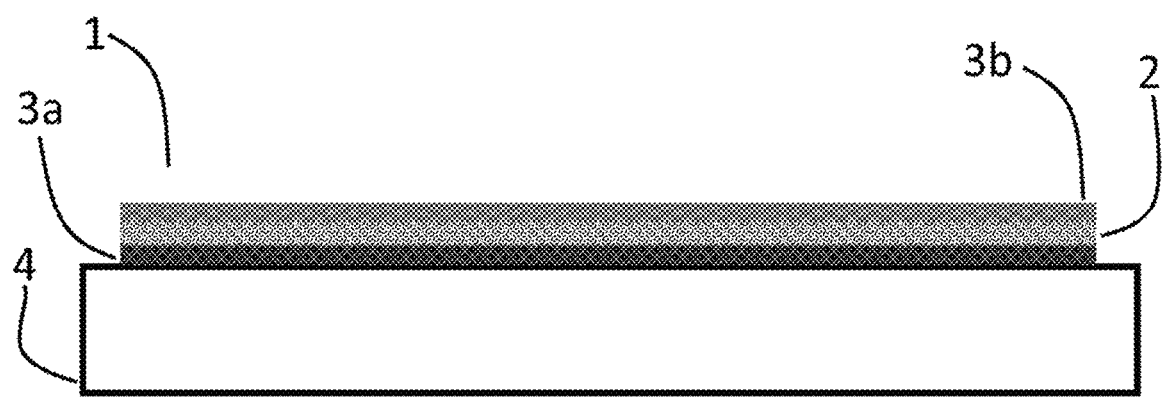
FIG. 1 shows a schematic cross-sectional view of a first embodiment of the present invention

In FIG. 1, a cross-sectional view of an NTC thin film thermistor 1 is shown. A first thin film electrode 3a, an NTC thin film 2 above it and a second thin film electrode 3b above it are arranged on a carrier material 4.

In this embodiment example, the carrier material 4 is electrically insulating and flat. A certain thermal stability of the carrier material 4 is required for possible thermal process steps for the production of the thin films, in which temperature of more than 500° C. can be reached. Suitable insulating and thermally stable materials for the carrier material 4 are poly- or single crystalline ceramics, passivated semiconductors, polymers or a glass. The poly- or single-crystalline ceramics may be, for example, YSZ, AlN, ZnO, alumina or sapphire, the passivated semiconductors may be, for example, a single-crystalline silicon with a SiOx passivation, and the polymers may be, for example, a polyimide.

Preferably, the carrier material 4 is very thin, with a thickness of not more than 100 μm and not less than 1 μm, but it can also be much thicker. Here and in the following, thickness refers to the extent in the stacking direction, i.e., perpendicular to the surface of the layers. The first thin film electrode 3a, the NTC thin film 2 and the second thin film electrode 3b are stacked on top of each other in the stacking direction. The NTC thin film thermistor 1 can be detached from the carrier material 4 after fabrication, or the carrier material 4 can be thinned. Known etching or grinding processes can be used for this purpose.

In addition, the carrier material 4 may also have functional properties and may comprise, for example, an integrated circuit (IC) or a microelectrical mechanical system (MEMS). In this way, the NTC thin film thermistor 1 can be connected to at least one other electrical component, for example a pressure sensor or a piezoelectric sensor, and thus different functions can be combined in one electrical component.

The first and second thin film electrodes 3a, 3b are arranged above and below the active NTC thin film 2 in the embodiment example of FIG. 1. The thin film electrodes 3a, 3b are preferably very thin, with a thickness of less than 10 μm. Chemical and physical deposition processes for thin films, such as PVD, CVD, CSD or galvanic processes, are suitable for forming the thin film electrodes 3a, 3b depending on the material used. The electrodes can be composed of one or more layers and of the same or different materials. Different electrodes and electrode layers may or may not be made of the same material. Suitable conductive materials for the electrodes include metals, alloys, intermetallic compounds, or conductive ceramics. The metals may be, for example, Cu, Ni, Ag, Au, Pt, Mo or Wo. The alloys may be, for example, Cr/Ni/Ag or Cr/Au. The intermetallic compounds may be titanium, nickel or molybdenum silicides. The conductive ceramics may be, for example, LNO or ITO.

The NTC thin film 2 is thinner than 3 μm, preferably even thinner than 1 μm, and is applied via one or more coating steps as well as thermal process steps. A suitable coating process for NTC thin films 2 is a CSD process in which the film is applied via spin coating, dip coating, spray coating or ink jet printing, for example. Deposition of the NTC thin film 2 via a PVD process is also possible. The NTC thin film 2 consists of a single-phase or multi-phase functional ceramic having a spinel or perovskite structure. Suitable elements for an NTC thin film 2 with a spinel structure are Ni, Mn, Co, Fe, Cu and Zr. For example, 80 at % Mn with 20 at % Ni may be a suitable mixing ratio for a functional ceramic with spinel structure used as an NTC thin film 2. A perovskite structure can be realized with the elements Y, Cr, Ca, Al and/or Mn.

Figure 2:
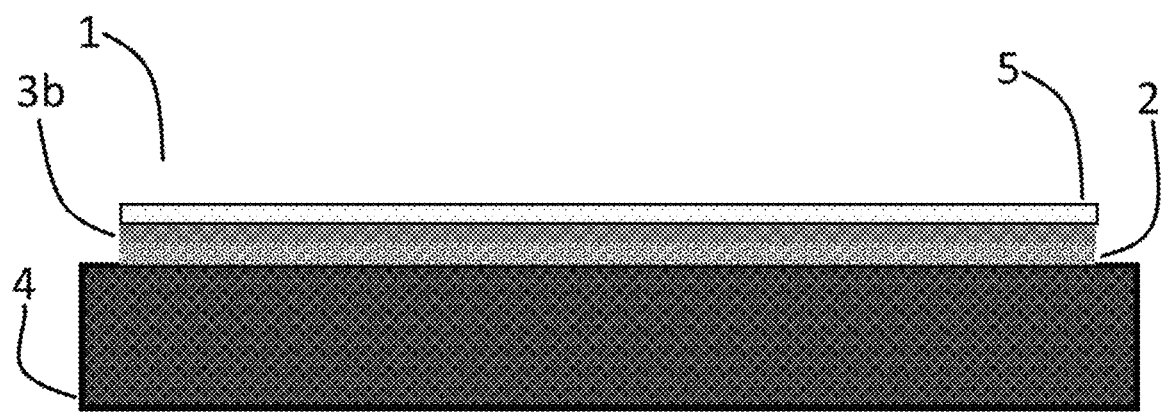
FIG. 2 shows a schematic cross-sectional view of a second embodiment, in which carrier material serves as a first electrode.

FIG. 2 shows a second embodiment of the invention, which is similar to the example in FIG. 1. In this example, too, three layers are applied on top of each other on a carrier material 4. In contrast to the first example, however, the carrier material 4 is here also simultaneously a first electrode or bottom electrode. An NTC thin film 2, a second thin film electrode 3b and a protective layer 5, are applied on top of each other on the carrier material 4, which also functions as a first electrode.

In this embodiment example, the carrier material 4 is sufficiently conductive to serve as a bottom electrode. Suitable materials are metals, alloys or highly doped semiconductors. Insulators coated with conductive material can also be used. In particular, the carrier material 4 can also be present as a conductive ceramic. Thus, it is particularly easy to connect the NTC thin film thermistor 1 to another electrical component which itself has a conductive ceramic. In this way, two or more functions of different components can be combined and integratively fused in one component.

The protective layer 5 is an electrical passive layer that protects the NTC thin film thermistor 1 from mechanical, chemical and other environmental influences. When the NTC thin film thermistor 1 is coated on one side with a protective layer 5, a thin film process can be used as for the other thin films, in particular also a PVD process. Alternatively, the NTC thin film sensor 2 can be bonded or welded in a film. Suitable materials for the protective layer 5 may be glass, silicone or other polymers. The protective layer 5 does not necessarily have to be applied to one side of the NTC thin film thermistor 1, as shown in FIG. 2, but can surround the NTC thin film thermistor 1. Particularly advantageous is an entire enclosure of the NTC thin film thermistor 1 in a protective layer 5, if this is detached from the carrier material 4 or has a particularly thin design.

Figure 3:
FIG. 3 shows a schematic cross-sectional view of a third embodiment

FIG. 3 shows a further embodiment of the invention, which is similar to the example in FIG. 2. Three layers are stacked on top of each other on a carrier material 4. In contrast to the previous example, however, the carrier material 4 is not conductive here and therefore does not act as an electrode. An NTC thin film 2 has been applied to the carrier material 4. Both, the first and second, thin film electrodes 3a, 3b were directly applied to the NTC thin film 2, although only one thin film electrode 3a, 3b is visible in FIG. 3. The thin film electrodes 3a, 3b and the NTC thin film 2 were also protected here against environmental influences by a protective layer 5.

Figure 4:
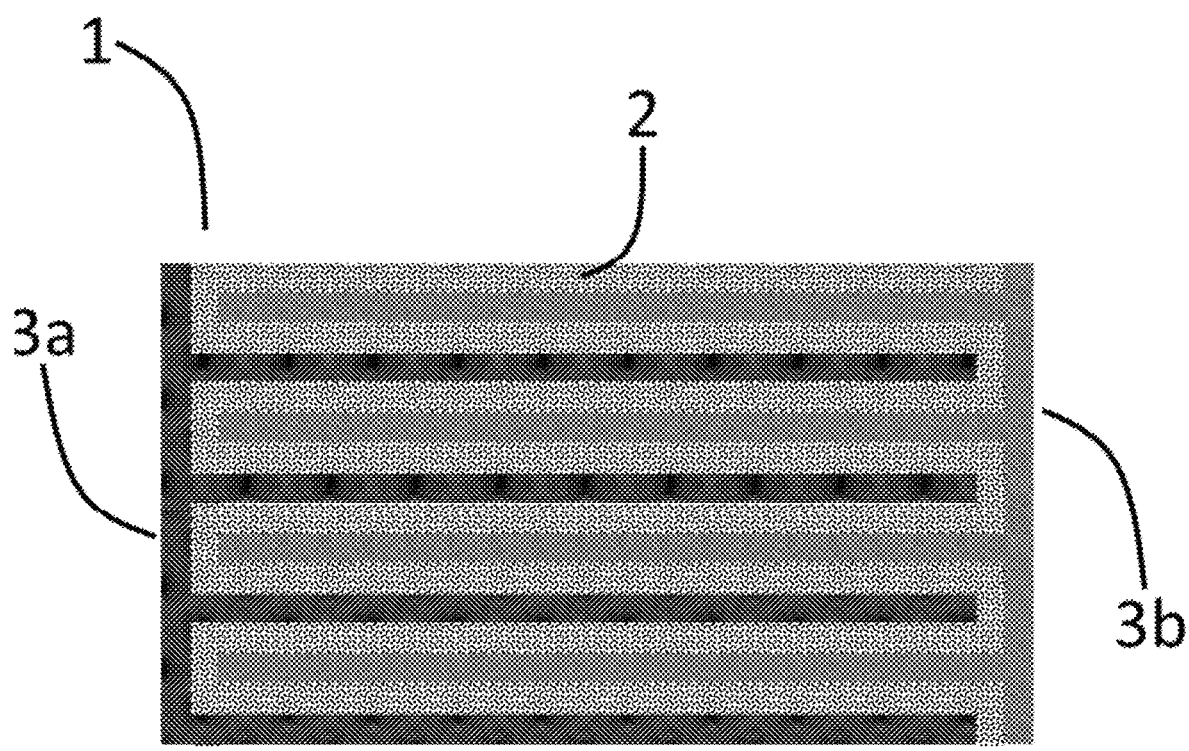
FIG. 4 shows a schematic top view of the third embodiment example

FIG. 4 shows a top view of an NTC thin film thermistor 1 in which both electrodes are arranged on the NTC thin film 2 as in the embodiment example shown in FIG. 3. The first and second thin film electrodes 3a, 3b are arranged in an interdigitated comb structure. Since the thin film electrodes 3a, 3b are equidistant from each other, the same electric field acts between the thin film electrodes 3a, 3b when a measurement voltage is applied. Therefore, the measurement current of an NTC thin film thermistor 1 provided with thin film electrodes 3a, 3b having an interdigitated comb structure exhibits advantageous linearity with respect to an applied measurement voltage. The electrode structure can be realized either directly when depositing the thin film electrodes 3a, 3b on the NTC thin film 2 by means of a aperture mask or via a lithographic process afterwards. Depending on the desired resistance and the design of the NTC thin film thermistor 1, a different arrangement of the thin film electrodes 3a, 3b may be more appealing.

Thanks to the arrangement of the first and second thin film electrodes 3a, 3b on one surface of the NTC thin film 2, the NTC thin film thermistor 1 can be designed to be particularly thin with a thickness of less than 50 µm. In addition, the requirement for the quality of the NTC thin film 2 can be lower because the measurement current flows relatively far along the surface and vertical defects of the NTC thin film 2 have little influence on it.

Figure 5:
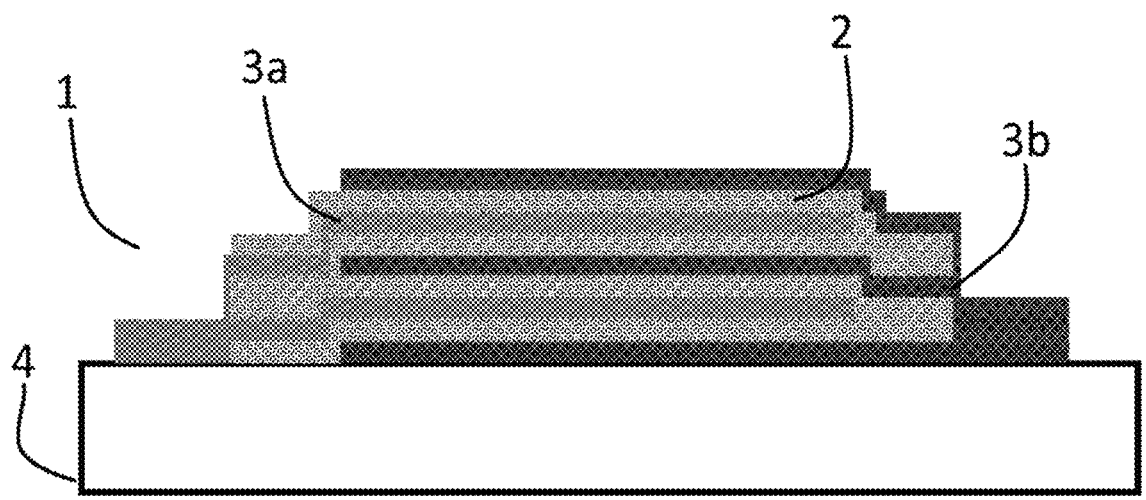
FIG. 5 shows a schematic cross-sectional view of a fourth embodiment

FIG. 5 shows a cross-sectional view of another embodiment. In this example, the NTC thin film thermistor 1 is a multilayer component. The first and second thin film electrodes 3a, 3b have been alternately deposited on the non-conductive carrier material 4, with an NTC thin film 2 always sandwiched between them. In the edge regions of a first and second side, one type of the thin film electrodes 3a, 3b respectively overhangs with respect to the NTC thin film 2, whereas the other type is shortened with respect to the NTC thin film 2. In this way, the thin film electrodes 3a, 3b of one kind can be easily connected to each other and at the same time a short circuit with the counter thin film electrode can be prevented. Due to the form-fitting contact of the respective thin film electrodes 3a, 3b on each other, the electrical contacting is improved via the increased contact surface between the adjacent thin film electrodes and the risk of one of the thin film electrodes not being electrically contacted is reduced.

It may be advantageous to form the inner electrodes of the multilayer NTC thin film thermistor 1 from a conductive ceramic, since this adheres well to the functional ceramic NTC thin films 2 and the entire active element of the NTC thin film thermistor 1 is fully ceramic. In this case, it may still be advantageous to form a bottom electrode and a top electrode of the multilayer structure from a metal or other conductive material.

Due to the layered structure and the overhangs, a staircase shape is formed on a first and second side of the NTC thin film thermistor 1, which tapers the component in the thickness direction. The thin film electrodes 3a, 3b can be shortened in the region in which they overhang relative to the NTC thin film 2, relative to the underlying thin film electrode 3a, 3b. Thus, contact surface area of thin film electrodes 3a, 3b can be increased and contact resistance of NTC thin film thermistor 1 can be decreased. An NTC thin film thermistor 1 with low contact resistance is especially suitable for precise measurements in high temperature ranges, since an NTC resistance decreases with increasing temperature.

The area in the center where all three types of layers overlap is the active measurement area of the NTC thin film thermistor 1. The areas where only one type of thin film electrode alternates with the NTC thin film 2 are irrelevant from a measurement point of view and should be kept as small as possible. At the edges where the thin film electrodes 3a, 3b are brought together, the electrodes can be contacted.

Figure 6:
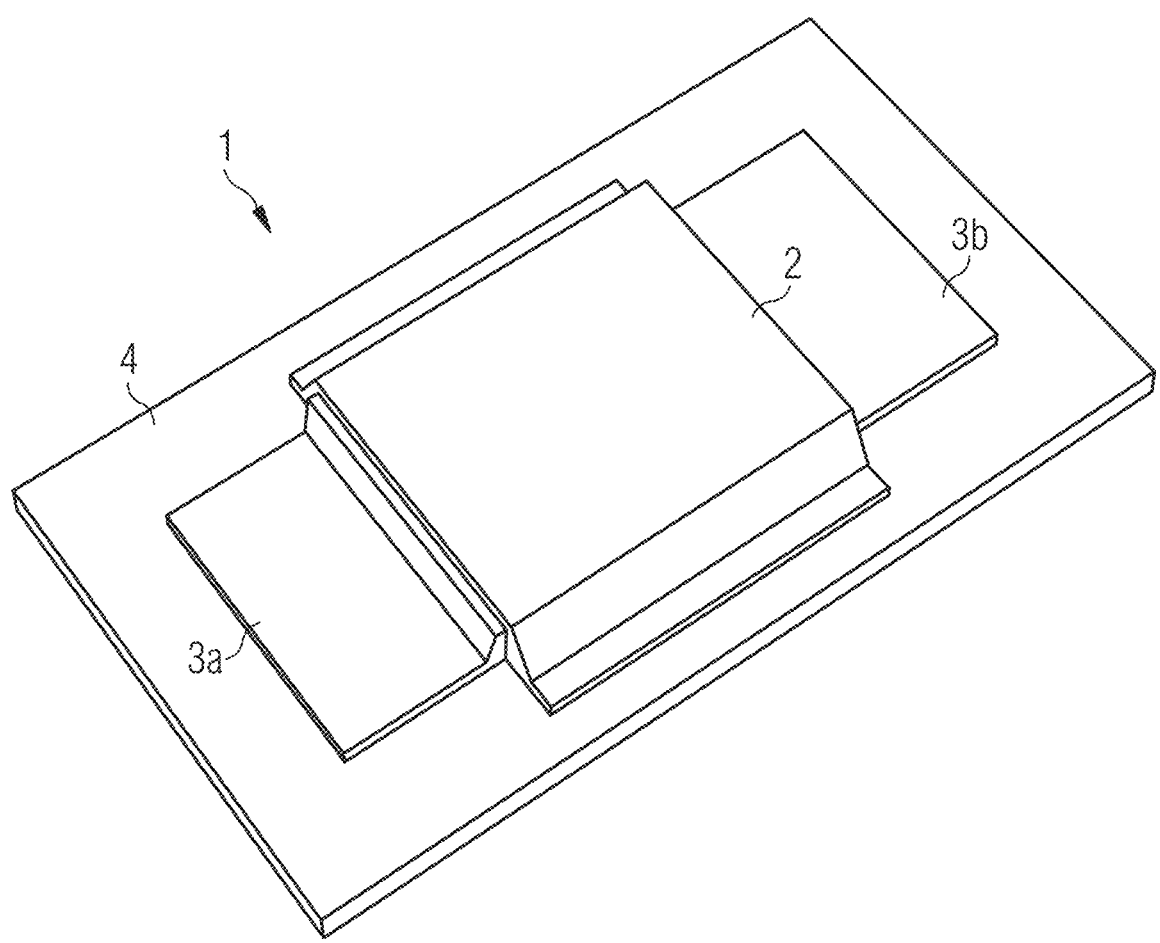
FIG. 6 shows a spatial view of a fourth embodiment
Figure 7:
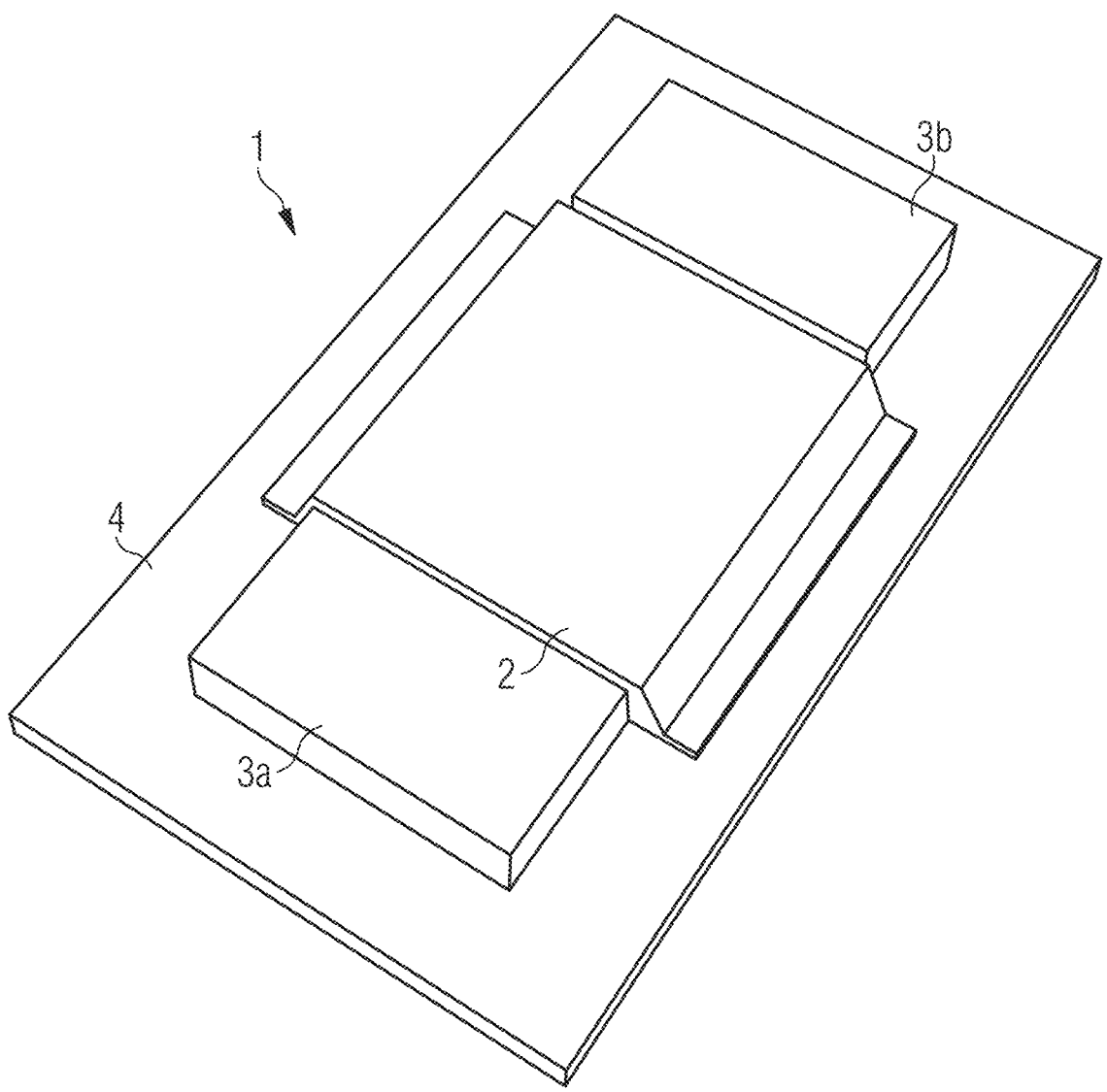
FIG. 7 shows a spatial view of the fourth embodiment with additional contact pads Identical elements, similar elements or elements that appear to be identical are marked with the same reference signs in the figures. The figures and the proportions in the figures are not to scale.

FIG. 6 shows a spatial representation of an NTC thin film thermistor 1, which also has a multilayer structure like the NTC thin film thermistor 1 of FIG. 5 and is arranged on a carrier material 4. In this embodiment example, the NTC thin films 2 overhang opposite the thin film electrodes 3a, 3b on a third and fourth side, which are perpendicular to the first and second side. The overhanging NTC material forms downward slopes on the third and fourth sides in FIG. 6. The overhang of the NTC thin films 2 ensures that the first and second thin film electrodes 3a, 3b are also encapsulated from each other in the edge regions. This ensures that first and second thin film electrodes 3a, 3b do not short-circuit with each other despite the small distance between them. Since the thin film electrodes 3a, 3b are still very thin at the edges, even though several layers are overlaid, it is advisable to reinforce the electrodes with a metallic paste, contact pads, a screen printing process, a thin film process or an electroplating process. In FIG. 7, the NTC thin film thermistor 1 from FIG. 6 is shown with additional contact pads.

The described layer structure has the consequence that the measuring current in these embodiment examples, in contrast to the embodiment example in which the thin film electrodes 3a, 3b are arranged on one surface of the NTC thin film 2, flows vertically through the NTC layer. On the one hand, this increases the demand on the quality of the NTC thin film 2, since defects have a greater effect on the measurement current, and on the other hand, the measurement accuracy does not depend on the size of the surface of the NTC thin film 2. Therefore, the layer structure can be used to realize NTC thin film thermistors 1 which, with a base area whose side length is between 80 and 120 µm and a thickness of less than 100 µm, are not only exceptionally thin but also have a small surface area.

Sensors with such a small surface area can be used, for example, in location-resolving measurements. If a plurality of NTC thin film thermistors 1 are arranged in a matrix according to one of the embodiment examples, this arrangement can be used to perform spatially resolved temperature measurement. Furthermore, electrical components with such a small size are predestined to be connected to or integrated with other electrical components. In particular, the NTC thin film thermistors 1 according to the present invention can

LIST OF REFERENCE SIGNS

1 NTC thin film thermistor
2 NTC thin film
3a first thin film electrode
3b second thin film electrode
4 carrier material
5 protective layer

The invention claimed is:

1. An NTC thin film thermistor comprising:
a plurality of first thin film electrodes;
a plurality of second thin film electrodes; and
at least two layers of NTC thin film, wherein a respective layer of the at least two layers of NTC thin film is disposed between a respective one of the plurality of first thin film electrodes and a respective one of the plurality of the second thin film electrodes,
wherein the plurality of first thin film electrodes overhangs on a first side of the NTC thin film thermistor with respect to the at least two layers of NTC thin film and the plurality of second thin film electrodes are shortened on the first side with respect to the at least two layers of NTC thin film, and
wherein the plurality of second thin film electrodes on a second side of the NTC thin film thermistor opposite to the first side overhangs with respect to the at least two layers of NTC thin film and the plurality of first thin film electrodes on the second side are shortened with respect to the at least two layers of NTC thin film.

2. The NTC thin film thermistor according to claim 1, wherein the NTC thin film comprises a single crystalline or polycrystalline functional ceramic having a spinel structure or a perovskite structure.

3. The NTC thin film thermistor according to claim 1, wherein the NTC thin film comprises at least one of Mn, Ni, Zn, Fe, Co, Cu, Zr, Y, Cr, Ca or Al.

4. The NTC thin film thermistor according to claim 1, wherein the plurality of first thin film electrodes or the plurality of second thin film electrodes consist of a conductive ceramic.

5. The NTC thin film thermistor according to claim 1, wherein the plurality of first thin film electrodes or the plurality of second thin film electrodes consist of one or more layers of metals, or Cu, Pt, Cr, Ni, Ag, Pd, Au, Ti, a mixture, or an alloy of these elements.

6. The NTC thin film thermistor according to claim 1, wherein each of the plurality of first thin film electrodes and each of the plurality of second thin film electrodes are disposed on a different surface of the at least two layers of NTC thin film.

7. The NTC thin film thermistor according to claim 6, wherein the plurality of first thin film electrodes and the plurality of second thin film electrodes are arranged in an interdigital comb structure.

8. The NTC thin film thermistor according to claim 1, wherein in a region where the plurality of first thin film electrodes or the plurality of second thin film electrodes overhang with respect to the at least two layers of NTC thin film,
(a) an adjacent first thin film electrode of the plurality of first thin film electrodes rests on an underlying first thin film electrode of the plurality of first thin film electrodes that overhangs with respect to the at least two layers of NTC thin film, or
(b) an adjacent second thin film electrode of the plurality of second thin film electrodes rests on an underlying second thin film electrode of the plurality of second thin film electrodes that overhangs with respect to the at least two layers of NTC thin film.

9. The NTC thin film thermistor according to claim 1, wherein in a region where the plurality of first thin film electrodes or the plurality of second thin film electrodes overhang with respect to the at least two layers of NTC thin film,
(a) an adjacent first thin film electrode of the plurality of second thin film electrodes is shorter than an underlying first thin film electrode of the plurality of second thin film electrodes that overhangs with respect to the at least two layers of NTC thin film, or
(b) an adjacent second thin film electrode of the plurality of second thin film electrodes is shorter than an underlying second thin film electrode of the plurality of second thin film electrodes that overhangs with respect to the at least two layers of NTC thin film.

10. The NTC thin film thermistor according to claim 1, wherein portions of the plurality of first thin film electrodes and portions of the plurality of second thin film electrodes overhanging at the first side and the second side are reinforced with a metallized paste or other conductive medium.

11. The NTC thin film thermistor according to claim 1, wherein the at least two layers of NTC thin film overhang with respect to the plurality of first thin film electrodes and the plurality of second thin film electrodes, the at least two layers of NTC thin film overhanging on a third side of the NTC thin film thermistor and a fourth side of the NTC thin film thermistor,
wherein both the third side and the fourth side are perpendicular to both the first side and the second side, and
wherein the third side and the fourth side are opposite beach other.

12. The NTC thin film thermistor according to claim 9, wherein in a region where the at least two layers of NTC thin film overhang with respect to the plurality of first thin film electrodes or the plurality of second thin film electrodes, an adjacent layer of NTC thin film is shorter than an underlying layer of NTC thin films.

13. The NTC thin film thermistor according to claim 1, wherein the NTC thin film thermistor is arranged on a carrier material.

14. The NTC thin film thermistor according to claim 13, wherein the carrier material is formed as one of the first electrodes in the plurality of first thin film electrodes.

15. The NTC thin film thermistor according to claim 13, wherein a circuit or a microelectronic mechanical system is integrated in the carrier material, or the carrier material is a part of an electronic component.

16. The NTC thin film thermistor according to claim 1, wherein one or more of the at least two layers of the NTC thin film is thinner than 3 μm.

17. The NTC thin film thermistor according to claim 1, wherein one or more of the plurality of first thin film electrodes or one or more of the plurality of second thin film electrodes are thinner than 10 μm.

18. The NTC thin film thermistor according to claim 1, wherein a thickness of the NTC thin film thermistor is less than 100 μm.

19. The NTC thin film thermistor according to claim 1, wherein the NTC thin film thermistor is suitable to be integrated into a substrate or a printed circuit board.

20. An arrangement comprising an NTC thin film thermistor according to claim 1 and
a printed circuit board,
wherein the NTC thin film thermistor is integrated in the printed circuit board.

21. An arrangement, comprising:
a plurality of NTC thin film thermistors according to claim 1,
wherein the NTC thin film thermistors are arranged in a matrix.

22. A method of manufacturing an NTC thin film thermistor comprising the steps of:
a) providing a non-conductive carrier material;
b) depositing at least one first thin film electrode;
c) applying at least one NTC thin film; and
d) applying at least one second thin film electrode,
wherein step b) can be performed before or after step c),
wherein in step b) the at least one first thin film electrode is also deposited in a first region where none of the at least one NTC thin film underlies,
wherein in step d) the at least one second thin film electrode is also deposited in a second region where none of the at least one NTC thin film underlies, and
wherein the first region and the second region do not overlap with each other, and
wherein:
a first one of the at least one first thin film electrode is first applied,
a first one of the at least one NTC thin film is applied after applying the first one of the at least one first thin film electrode,
a first one of the at least one second thin film electrode is applied after applying the first one of the at least one NTC thin film,
a second one of the at least one NTC thin film is applied after applying the first one of the at least one second thin film electrode, and
a second one of the at least one first thin film electrode is applied after applying the second one of the at least one NTC thin film.

23. The method according to claim 22,
wherein the at least one NTC thin film is deposited using a chemical solution deposition (CSD) method.

24. The method according to claim 22,
wherein the at least one first thin film electrode, the at least one second thin film electrode, and the at least one NTC thin film are deposited by a PVD, or CVD process.

25. The method according to claim 22,
wherein in a further process step the NTC thin film thermistor is subjected to a sintering process.

26. The method according to claim 22,
wherein in a further process step a layer stack consisting of the at least one first thin film electrode, the at least one second thin film electrode, and the at least one NTC thin film is detached from the carrier material, or the carrier material is thinned out or completely removed by means of a grinding process or etching process.

27. A method of manufacturing an NTC thin film thermistor comprising the steps of:
a) providing a non-conductive carrier material;
b) depositing a layer of first thin film electrode;
c) applying a layer of an NTC thin film;
d) applying a layer of second thin film electrode,
wherein step b) can be performed before or after step c); and
e) repeating steps b), c), and d) to obtain:
(i) a plurality of first thin film electrodes,
(ii) a plurality of second thin film electrodes, and
(iii) at least two layers of NTC thin film,
wherein a respective layer of the at least two layers of NTC thin film is disposed between one layer of the plurality of first thin film electrodes and one layer of the plurality of the second thin film electrodes,
wherein the plurality of first thin film electrodes on a first side of the NTC thin film thermistor overhangs with respect to the at least two layers of NTC thin film and the plurality of second thin film electrodes are shortened on the first side with respect to the at least two layers of NTC thin film, and
wherein the plurality of second thin film electrodes on a second side of the NTC thin film thermistor opposite to the first side overhangs with respect to the at least two layers of NTC thin film and the plurality of first thin film electrodes on the second side are shortened with respect to the at least two layers of NTC thin film.

* * * * *

UNITED STATES PATENT AND TRADEMARK OFFICE
CERTIFICATE OF CORRECTION

PATENT NO. : 12,033,774 B2
APPLICATION NO. : 17/617760
DATED : July 9, 2024
INVENTOR(S) : Thomas Stendel et al.

Page 1 of 1

It is certified that error appears in the above-identified patent and that said Letters Patent is hereby corrected as shown below:

In the Claims

At Column 12, Lines 41-42 (Claim 11), please delete "opposite beach other" and insert --opposite each other-- therefor.

At Column 12, Line 47 (Claim 12), please delete "NTC thin films" and insert --NTC thin film-- therefor.

Signed and Sealed this
Twenty-seventh Day of August, 2024

Katherine Kelly Vidal
*Director of the United States Patent and Trademark Office*